United States Patent [19]
Sako

[11] Patent Number: 5,245,216
[45] Date of Patent: Sep. 14, 1993

[54] PLASTIC-MOLDED TYPE SEMICONDUCTOR DEVICE

[75] Inventor: Shigeki Sako, Yokohama, Japan

[73] Assignee: Kabushiki Kaisha Toshiba, Kawasaki, Japan

[21] Appl. No.: 3,826

[22] Filed: Jan. 8, 1993

Related U.S. Application Data

[63] Continuation of Ser. No. 757,272, Sep. 10, 1991, abandoned.

[30] Foreign Application Priority Data

Sep. 11, 1990 [JP] Japan ................... 2-238883

[51] Int. Cl.$^5$ ............................... H01L 23/28
[52] U.S. Cl. ................... 257/676; 257/691; 257/711; 257/723; 257/724; 257/787; 257/796
[58] Field of Search ............ 357/72, 80, 81; 257/676, 685, 691, 700, 711, 723, 724, 787, 788, 791, 796

[56] References Cited

U.S. PATENT DOCUMENTS 4,962,415 10/1990 Yamamoto ................ 357/72
5,049,977 9/1991 Sako ........................ 357/72

Primary Examiner—Steven Mottola
Assistant Examiner—R. A. Ratliff
Attorney, Agent, or Firm—Finnegan, Henderson, Farabow, Garrett & Dunner

[57] ABSTRACT

A plastic-molded type semiconductor device according to the present invention has two islands, on which semiconductor elements are mounted. An insulating circuit board is formed so as to extend over the two islands. On the insulating circuit board, wires are formed. Resin is molded so as to cover the two islands and insulating circuit board. The insulating circuit board overlaps the two islands only at its edges, so that there exists no island just below the insulating circuit board. This reduces the island area and makes it harder for resin cracks to occur, compared with a conventional equivalent.

7 Claims, 5 Drawing Sheets

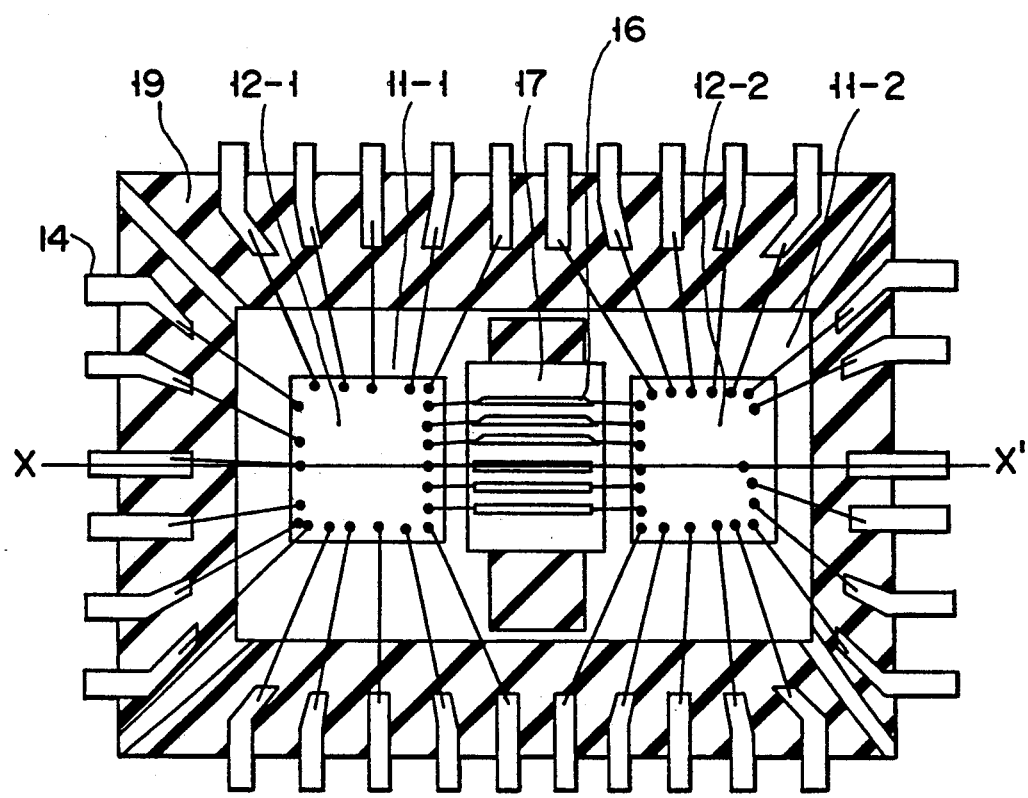
F I G. 9
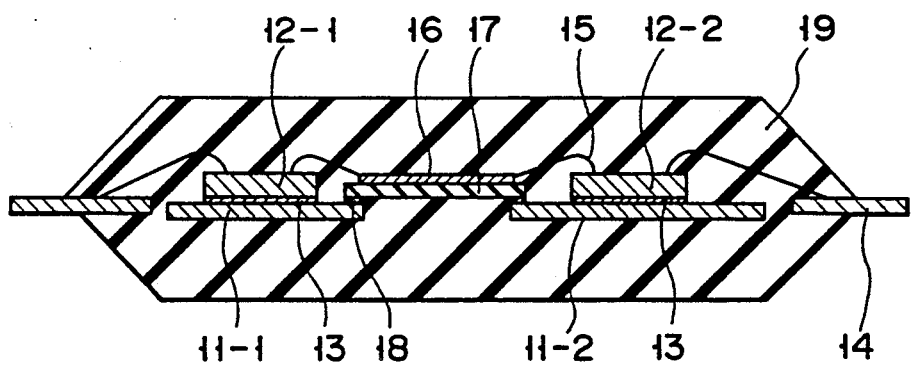
F I G. 10

PLASTIC-MOLDED TYPE SEMICONDUCTOR DEVICE

This application is a continuation of application Ser. No. 07/757,272 filed Sep. 10, 1991, now abandoned.

BACKGROUND OF THE INVENTION

1. Field of the Invention

This invention relates to improvements in a surface-mounting plastic-molded type semiconductor device having a lead frame, insulating circuit board, and bonding wires.

2. Description of the Related Art

FIG. 1 shows a conventional plastic-molded type semiconductor device. FIG. 2 is a sectional view taken along line X—X' of FIG. 1. In FIGS. 1 and 2, numerals 1-1 and 1-2 indicate semiconductor elements, 2 an island, 3 an insulating circuit board, 4 wires, 5 bonding wires, 6 a molding resin, 7 inner leads, 8 a semiconductor element adhesive, and 9 an insulating circuit board adhesive.

In the semiconductor device, the semiconductor elements 1-1 and 1-2 have the same substrate potential. The semiconductor device has the insulating circuit board 3 on the surface of which a plurality of wires 4 are formed. The semiconductor elements 1-1 and 1-2 are connected to each other by the wires 4 and bonding wires 5. This arrangement prevents shorts even when wiring is complicated.

FIG. 3 shows another conventional plastic-molded type semiconductor device. FIG. 4 is a sectional view taken along line X—X' of FIG. 3. In FIGS. 3 and 4, the same parts as those in FIGS. 1 and 2 are indicated by the same reference characters.

In this semiconductor device, the semiconductor elements 1-1 and 1-2 differ in substrate potential. The semiconductor device has a plurality of islands 2-1 and 2-2, on which the semiconductor elements 1-1 and 1-2 are mounted, respectively.

In the semiconductor device of FIGS. 1 and 2, however, the insulating circuit board 3 is mounted on the island 2. Since in the semiconductor device of FIGS. 3 and 4, the insulating circuit board 3 is mounted on either of the islands, for example, on the island 2-2, the island area must be large enough to accommodate both the semiconductor device 1-2 and the insulating circuit board 3. It is known that an increase in the island area causes the shortcomings described below in mounting the semiconductor device.

Plastic-molded type semiconductor devices are generally mounted on a printed board by a technique such as solder dipping, infrared reflow, vapor phase, or hot air. During the mounting process, the semiconductor devices are heated rapidly, so that thermal stress occurs. This thermal stress vaporizes water accumulated between the island 2 and the molding resin 6, which causes cracks 10 in the resin as shown in FIG. 5. The cracks often reach the surface of the resin 6, which impairs the humidity resistance of the semiconductor device, making the device defective.

The occurrence of resin cracks 10 has relation to the island area 2 and resin thickness as shown in FIG. 6. That is, the greater the island area 2, or the thinner the resin 6 thickness, the more easily resin cracks 10 take place.

However, surface-mounting type semiconductor devices are thinner than DIPs (Dual-in-Line Plug Packages) or the like, so that resin cracks 10 occur more easily. Thus, to prevent resin cracks 10 from taking place, some measures must be taken. An increase in the resin thickness of surface-mounting type semiconductor devices goes against a tendency to make products lighter, thinner, shorter, and smaller, which fails to meet the users' needs and produce thinner packages. Consequently, it is not desirable to thicken the resin 6 of the semiconductor devices.

SUMMARY OF THE INVENTION

Accordingly, the object of the present invention is to prevent resin cracks due to thermal stress from occurring.

The foregoing object is accomplished by a plastic-molded type semiconductor device comprising: a plurality of islands on which semiconductor elements are mounted; an insulating circuit board formed so as to extend over the plurality of islands; and a resin molded so as to cover the plurality of islands and the insulating circuit board.

The foregoing object is also accomplished by a semiconductor device comprising: a plurality of islands on which semiconductor elements are mounted and which are electrically connected to each other; an insulating circuit board formed so as to extend over the plurality of islands; and a resin molded so as to cover the plurality of islands and the insulating circuit board.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 9 is a plan view of a semiconductor device according to a second embodiment of the present invention; and FIG. 10 is a sectional view taken along line X—X' of FIG. 9.

DETAILED DESCRIPTION OF THE PREFERRED EMBODIMENTS

Referring to the accompanying drawings, the embodiments of the present invention will be explained in detail.

Figure 7:
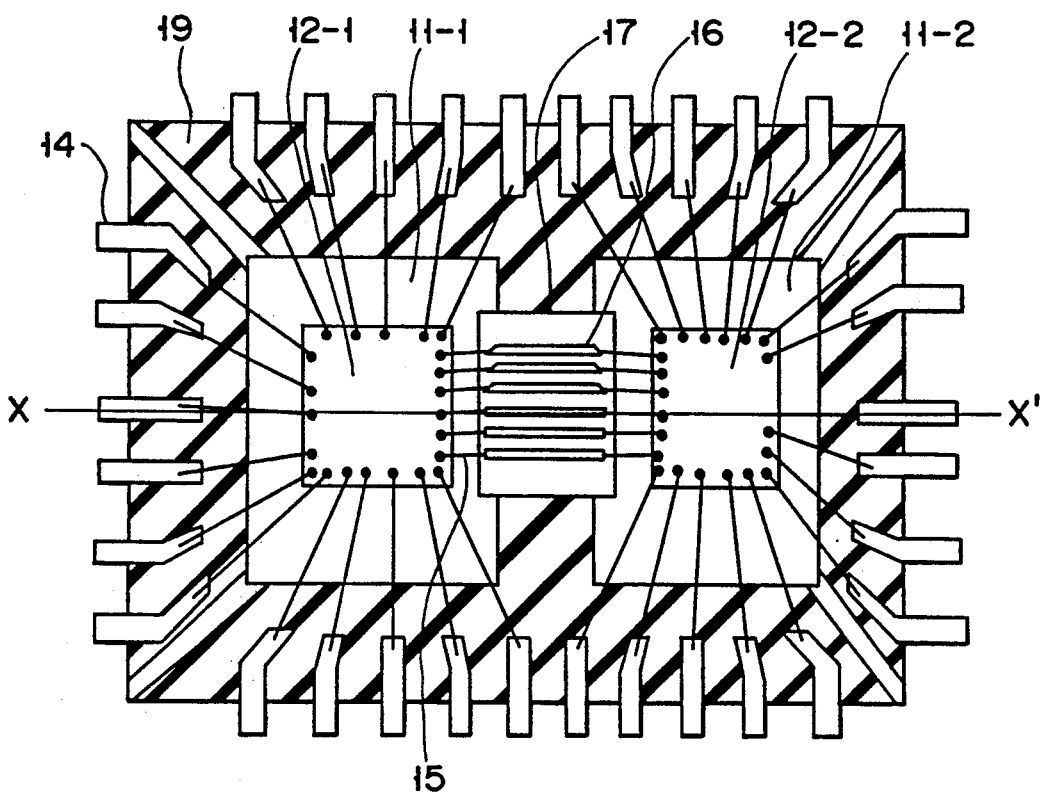
FIG. 7 is a plan view of a semiconductor device according to a first embodiment of the present invention.
Figure 8:
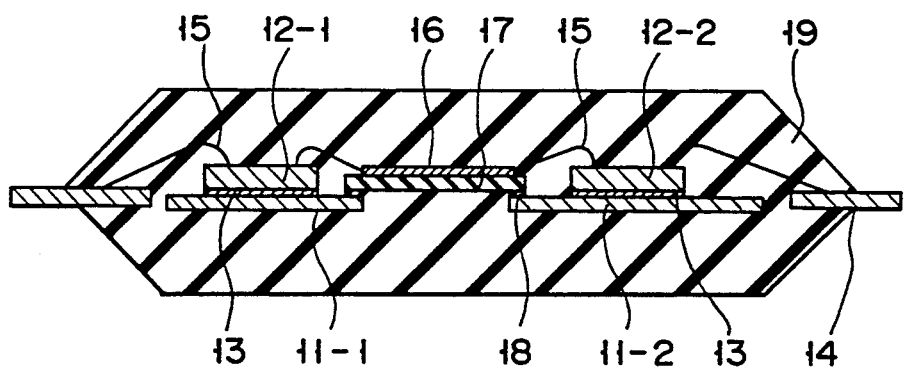
FIG. 8 is a sectional view taken along line X—X' of FIG. 7.

FIG. 7 shows a plastic-molded type semiconductor device according to a first embodiment of the present invention. FIG. 8 is a sectional view taken on line X—X' of FIG. 7. Numerals 11-1 and 11-2 indicate islands, 12-1 and 12-2 semiconductor elements, 13 a semiconductor element adhesive, 14 inner leads, 15 bonding wires, 16 wires, 17 an insulating circuit board, 18 an insulating circuit board adhesive, and 19 a molding resin.

The semiconductor device has a plurality of islands, for example, two islands 11-1 and 11-2. Onto these islands 11-1 and 11-2, semiconductor elements 12-1 and 12-2 are bonded with the adhesive 13, respectively. The semiconductor elements 12-1 and 12-2 are connected to the corresponding inner leads with the bonding wires 15. The insulating circuit board 17 is formed so as to extend over the two islands 11-1 and 11-2. The insulating circuit board 17 is bonded to the islands 11-1 and 11-2 with the adhesive 18 only at the overlapped portions. Thus, there exists no island below the insulating circuit board 17 except for its edges. Since the semiconductor elements 12-1 and 12-2 are mounted on the islands 11-1 and 11-2 insulated from each other, the individual substrate potentials can be set independently. The semiconductor elements 12-1 and 12-2, insulating circuit board 17, and others are sealed by the molding resin 19.

Figure 1:
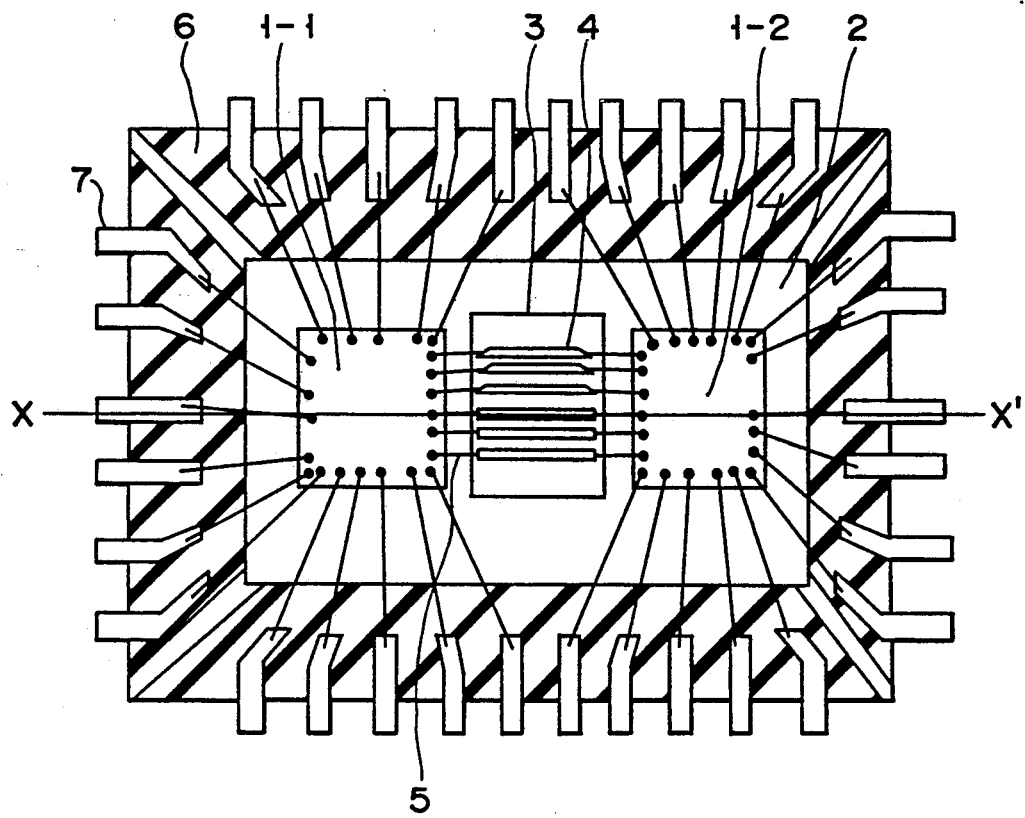
FIGS. 1 and 3 are plan views of conventional semiconductor devices.
Figure 2:
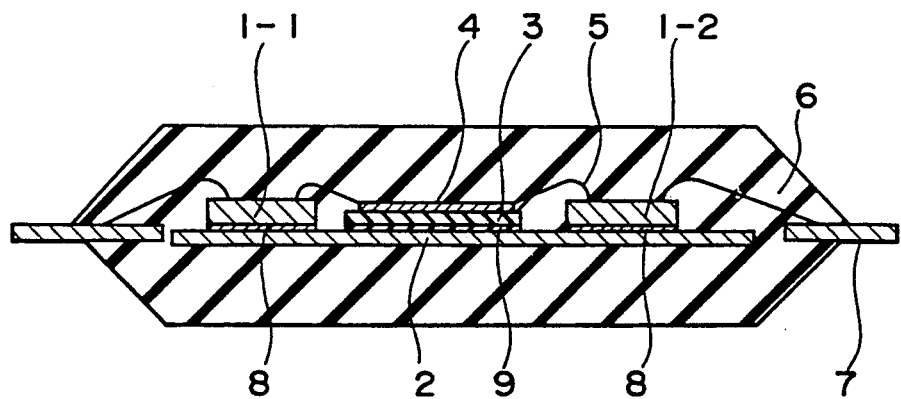
FIG. 2 is a sectional view taken along line X—X' of FIG. 1.
Figure 3:
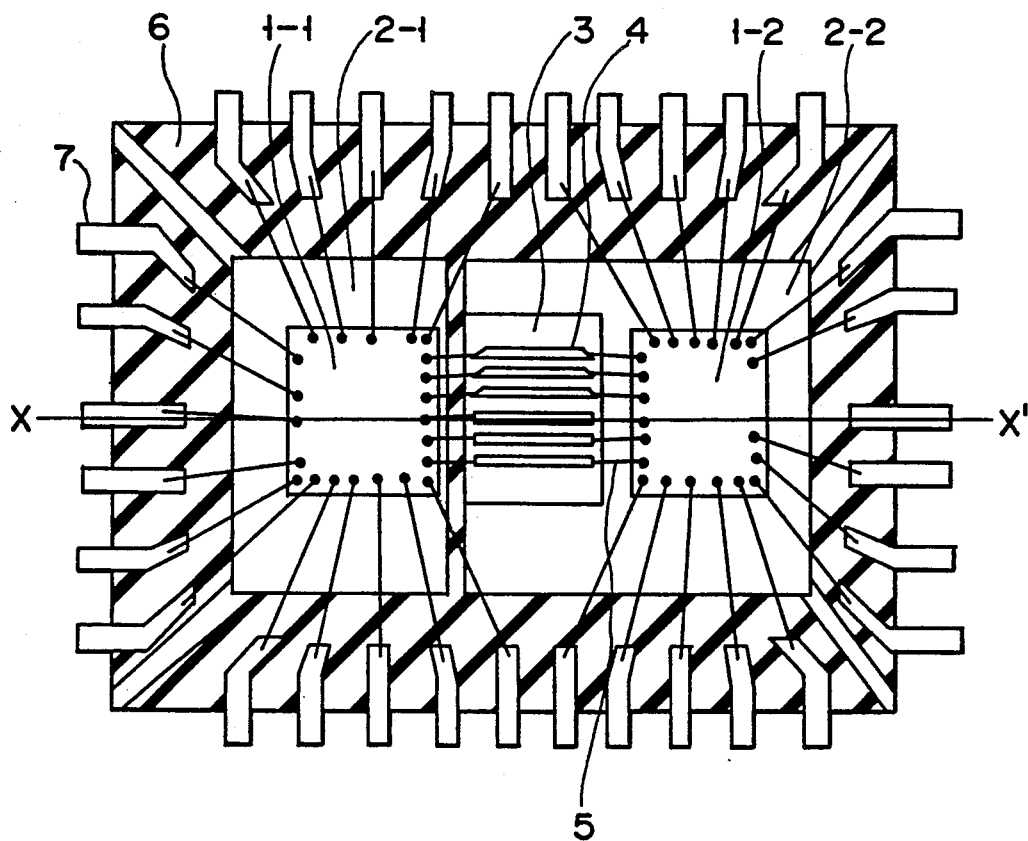
Figure 4:
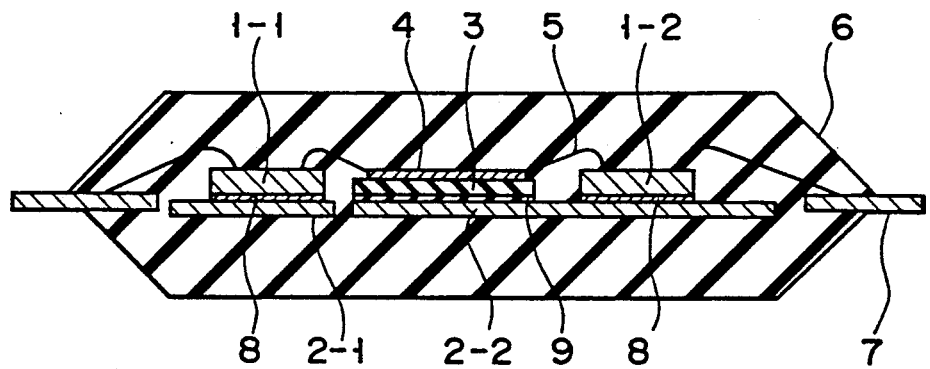
FIG. 4 is a sectional view taken along line X—X' of FIG. 3.
Figure 5:
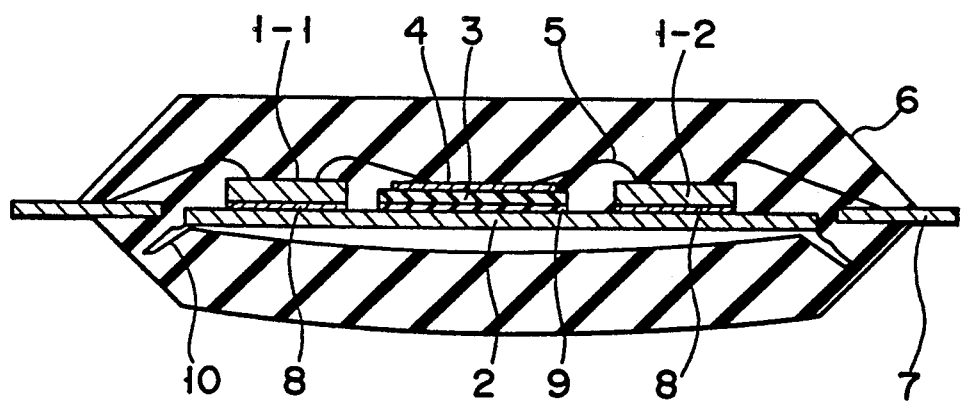
FIG. 5 is a sectional view showing resin cracks occurring in a conventional semiconductor device.
Figure 6:
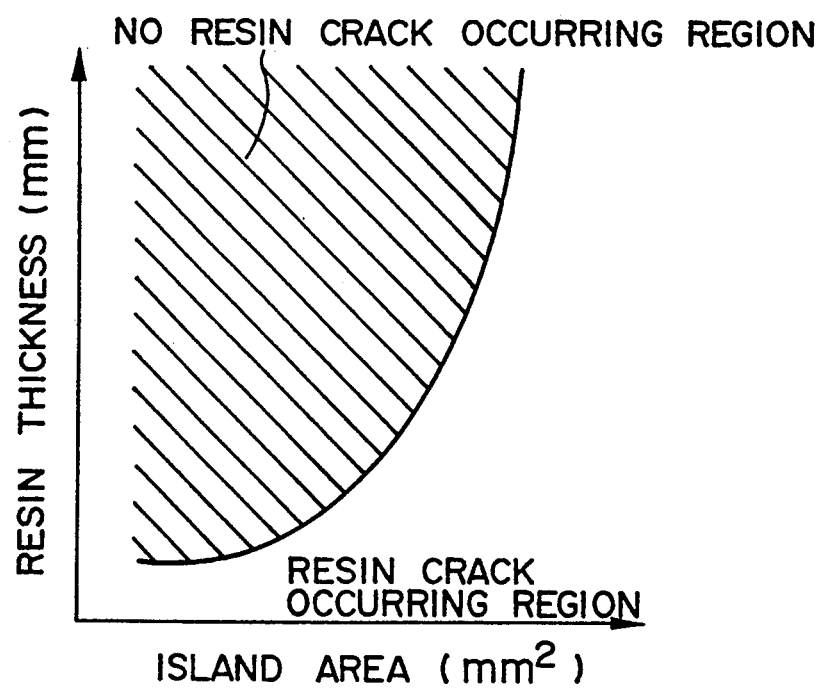
FIG. 6 illustrates the relationship between the island area and the resin thickness.

With this arrangement, the insulating circuit board 17 is formed so as to extend over the two islands 11-1 and 11-2 with no island below the circuit board 17, which reduces the island area compared with a conventional equivalent. As seen from the relationship in FIG. 6, resin cracks are less liable to occur. According to the present invention, the island area per chip may be as large as that of a monolithic IC. This reduces the vapor pressure due to thermal stress during mounting, preventing resin cracks from taking place. This makes great improvements in the humidity resistance of the semiconductor device and greatly reduces its defective appearance.

FIG. 9 illustrates a plastic-molded type semiconductor device according to a second embodiment of the present invention. FIG. 10 is a sectional view taken on line X—X' of FIG. 9.

This embodiment differs from the first embodiment in that the two islands are electrically connected to each other. It may be considered that a square hole is made in one island. The substrates of the semiconductor elements mounted 12-1 and 12-2 on the islands 11-1 and 11-2 are at the same potential.

With this configuration, there is no island below the insulating circuit board 17 either, so that the island area may be reduced compared with a conventional equivalent. Therefore, the second embodiment provides the same effects as with the first embodiment.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A semiconductor device comprising:
    a plurality of islands laterally spaced from one another, each having a top surface;
    a semiconductor element mounted on the top surface of each of said plurality of islands;
    an insulating circuit board having at least a first and second edge engaging adjacent edges of the top surface of at least two of said plurality of islands and bridging the space between the at least two of said plurality of islands;
    wires on the insulating circuit board substantially extending from at least the first edge to the second edge;
    a plurality of bonding wires electrically connecting at least one of the semiconductor elements to the wires at the first edge of the insulating circuit board and electrically connecting at least one other of the semiconductor elements to the wires at the second edge of the insulating circuit board, thereby electrically connecting at least two of the semiconductor elements to one another; and
    a molded resin encapsulating and in engagement with exposed surfaces of said plurality of islands, said semiconductor elements, and opposite surfaces of said insulating circuit board.

2. A semiconductor device according to claim 1, wherein said plurality of islands is two islands.

3. A semiconductor device according to claim 1, wherein said insulating circuit board overlaps a predetermined region of said adjacent edges.

4. A semiconductor device comprising:
    a plurality of islands laterally spaced from one another and electrically connected to each other, each of said plurality of islands having a top surface;
    a semiconductor element mounted on the top surface of each of said plurality of islands;
    an insulating circuit board having at least a first and second edge engaging adjacent edges of the top surface of at least two of said plurality of islands and bridging the space between the at least two of said plurality of islands;
    wires on the insulating circuit board substantially extending from at least the first edge to the second edge;
    a plurality of bonding wires electrically connecting at least one of the semiconductor elements to the wires at the first edge of the insulating circuit board and electrically connecting at least one other of the semiconductor elements to the wires at the second edge of the insulating circuit board, thereby electrically connecting at least two of the semiconductor elements to one another; and
    a molded resin encapsulating and in engagement with exposed surfaces of said plurality of islands, said semiconductor elements, and opposite surfaces of said insulating circuit board.

5. A semiconductor device according to claim 4, wherein said plurality of islands is two islands.

6. A semiconductor device according to claim 4, wherein said insulating circuit board overlaps a predetermined region of said adjacent edges.

7. A semiconductor device comprising:
    an island defining an opening with laterally spaced opposing edges, said island having a top surface;

at least two semiconductor elements mounted on the top surface of said island;

an insulating circuit board having at least a first and second edge bridging said opening and engaging the top surface of said laterally spaced opposing edges;

wires on the insulating circuit board substantially extending from at least the first edge to the second edge;

a plurality of bonding wires electrically connecting at least one of the semiconductor elements to the wires at the first edge of the insulating circuit board and electrically connecting at least one other of the semiconductor elements to the wires at the second edge of the insulating circuit board, thereby electrically connecting at least two of the semiconductor elements to one another; and a molded resin encapsulating said island, said at least one semiconductor element, and opposing surfaces of said insulating circuit board.

* * * * *